United States Patent
Johnson et al.

[11] Patent Number: 6,040,883
[45] Date of Patent: Mar. 21, 2000

[54] PROGRAMMABLE HOLOGRAM GENERATOR

[75] Inventors: Kristina M. Johnson, Longmont; Chong Chang Mao, Louisville, both of Colo.

[73] Assignee: University Technology Corporation, Boulder, Colo.

[21] Appl. No.: 08/775,952

[22] Filed: Jan. 3, 1997

Related U.S. Application Data

[60] Provisional application No. 60/009,652, Jan. 4, 1996.

[51] Int. Cl.[7] ............................... G02F 1/133; G02F 1/13
[52] U.S. Cl. ....................... 349/116; 349/116; 349/172; 283/73; 283/74; 283/75; 283/86; 380/54; 359/11; 350/3.66; 350/342
[58] Field of Search ..................... 349/116, 172; 350/3.66, 342; 359/11; 380/54; 283/73–75, 86

[56] References Cited

U.S. PATENT DOCUMENTS

| | | | |
|---|---|---|---|
| 3,296,594 | 1/1967 | Heerden | 340/172.5 |
| 3,782,802 | 1/1974 | Micheron et al. | 350/3.5 |
| 3,892,465 | 7/1975 | Micheron et al. | 350/3.5 |
| 4,063,795 | 12/1977 | Huignard et al. | 350/3.5 |
| 4,367,724 | 1/1983 | Willett | 126/20 |
| 4,878,717 | 11/1989 | Gerritsen | 350/3.66 |
| 4,941,735 | 7/1990 | Moddel et al. | 350/342 |
| 5,073,010 | 12/1991 | Johnson et al. | 359/72 |
| 5,177,628 | 1/1993 | Moddel | 359/72 |
| 5,206,674 | 4/1993 | Puech et al. | 353/122 |

OTHER PUBLICATIONS

Yam, Philip, "Plastics, Benjamin . . . ", Scientific American (Jun., 1993), p. 140.

*Primary Examiner*—William L. Sikes
*Assistant Examiner*—Julie Ngo
*Attorney, Agent, or Firm*—Fleshner & Kim

[57] ABSTRACT

A programmable hologram generator comprises a layered structure of a pixelated VLSI chip, a reflective ferroelectric liquid crystal that is physically disposed on the VLSI chip, and a photorefractive crystal that is physically disposed on the liquid crystal. The VLSI chip is controlled by a computer wherein holograms are digitally stored. The reflective state of the individual pixel areas of the liquid crystal are controlled or selected by this computer control of the VLSI chip. A desired hologram is written into the photorefractive crystal by a reference beam that illuminates the photorefractive crystal, and by an illumination beam that is reflected from the selected pixels of the liquid crystal and thereafter interferes with the reference beam. The hologram that is written into the photorefractive crystal is a function of the control of the reflective state of the pixels of the liquid crystal, as this reflective state is in turn controlled by the pixels of the VLSI chip.

25 Claims, 7 Drawing Sheets

PROGRAMMABLE HOLOGRAM GENERATOR

RELATED APPLICATIONS

This is a regular application based on a provisional application under 37 C.F.R. §1.53(b)(2) having Ser. No. 60/009,652, filed Jan. 4, 1996, and this regular application claims priority thereof.

This invention was made with Government support under a contract by the national Science Foundation. The Government has certain rights in this invention.

BACKGROUND OF THE INVENTION

1. Field of the Invention

This invention relates to the field of optics systems, and more specifically to systems for generating information storing holograms.

2. Background of the Related Art

The use of optical systems to generate holograms is generally known, as is the use of crystals in such an optical system. Examples of prior devices are as follows.

U.S. Pat. No. 3,296,594 shows the storage of a plurality of images in a bleachable crystal using an object and a reference beam. The focus position of the reference beam is changed for each image to thereby vary the area of storage within the crystal. In order to readout the stored images, the position of the reference beam is changed to the desired readout position, and the thus generated image is read out.

U.S. Pat. No. 3,782,802 describes the bulk storage of phase holograms in a ferroelectric crystal. The crystal has a hysteresis curve. The application of an initial voltage establishes a remnant state for the crystal. An object beam and a reference beam are used to write a hologram in the crystal when the voltage applied to the crystal is zero. This write period is followed by a nonillumination period during which the hologram is "fixed" by the application of a reverse polarity voltage. Thereafter, the reference beam is reapplied to the crystal.

U.S. Pat. No. 3,892,465 describes the writing of holograms to a ferroelectric crystal wherein electric fields of different values are applied to the crystal during writing and reading of the holograms.

U.S. Pat. No. 4,063,795 describes an electro-optic holographic storage device having a ferroelectric crystal whose opposite surface electrodes are shorted. A reference beam and an object beam write a hologram to the crystal with zero phase shift applied to the reference beam. In order to erase this hologram, the hologram is rewritten using a 90 degree phase shift in the reference beam.

U.S. Pat. No. 4,878,717 provides a liquid crystal variable reflectance device that enables the writing of holograms from a computer to a holographic plate. The various images to be written are provided by a computer to the liquid crystal to thereby control its reflective state as a function of the image. The object beam then reflects off of the liquid crystal to the holographic plate, where interference with a reference beam enables a hologram to be written.

U.S. Pat. No. 5,206,674 describes a light intensity amplifier wherein a low intensity light is modulated by a liquid crystal. This modulated low intensity light is presented to a photorefractive crystal along with an unmodulated high intensity beam. The output of the photorefractive crystal is a modulated high intensity beam.

The publication SCIENTIFIC AMERICAN, June 1993 at page 140 describes the use of photorefractive materials to store holograms.

The present invention utilizes a pixelated liquid crystal structure. U.S. Pat. Nos. 4,941,735, 5,073,010 and 5,177,628, incorporated herein by reference, show such a pixelated structure. Above-noted U.S. Pat. No. 5,073,010 also shows the use of a semiconductor substrate adjacent to a ferroelectric liquid crystal layer.

The present invention utilizes a ferroelectric liquid crystal. U.S. Pat. No. 4,367,924, incorporated herein by reference, discloses such a liquid crystal.

While prior devices as exemplified above are generally useful for their limited intended purposes, the need remains in the art for a programmable hologram generator comprising a layered structure of a VLSI chip, a reflective ferroelectric liquid crystal that is physically disposed on the VLSI chip, and a photorefractive crystal that is physically disposed on the liquid crystal, wherein programming of the VLSI chip determines the hologram that is written into the photorefractive crystal, this hologram being a function of the control of the reflective state of the liquid crystal, as this reflective state is in turn controlled by control of the VLSI chip.

The above references are incorporated by reference herein where appropriate for appropriate teachings of additional or alternative details, features and/or technical background.

SUMMARY OF THE INVENTION

This invention provides a method, a system and an apparatus for generating holograms in which information is stored. A storage device in accordance with the invention stores holograms in a photorefractive crystal by introducing hologram-defining electrical signals to a pixelated VLSI chip. This chip, in turn, operates to modulate a reflective liquid crystal. A preferred reflective liquid crystal is a reflective ferroelectric liquid crystal. A preferred photorefractive crystal is a cobic $NeLiO_3$ photorefractive crystal.

While the invention is of general holographic utility, specific examples of utility are real time optical SAR pattern recognition, optical interconnection devices, and optical neural networks.

The pixelated VLSI chip contains a two dimensional array of pixelated reflective metal pads that are selectively controlled so as to modulate the pixels of the reflective liquid crystal to on and off states in a manner to store a desired hologram in the photorefractive crystal. More specifically, a computer output controls the pixelated VLSI chip so as to provide a desired array of on/off states in the reflective liquid crystal. This desired array of on/off states in turn provides a reflected light wave front that operates to write the desired hologram into the photorefractive crystal, this hologram being defined by the computer control of the VLSI chip.

As a feature of the invention, the VLSI chip may also include a two dimensional array of pixelated photo detectors. These photodetectors are used to read out the holograms that are stored in the photorefractive crystal, as the output of the photodetector array is interrogated by a computer.

An object of the invention is to provide a layered physical structure comprising a VLSI chip, a reflective liquid crystal, and a photorefractive crystal having an optic axis. An image is electrically written into the VLSI chip so as to modulate the reflective state of the liquid crystal in a pixel fashion. A reference beam is provided to the photorefractive crystal, the reference beam having a polarization. An illumination beam of a polarization perpendicular to the optic axis of the photorefractive crystal and perpendicular to the polarization of the reference beam is provided. Reflection of the illumination beam from the pixels of the reflective liquid crystal operates to interfere with the reference beam, and thereby a hologram is written in the photorefractive crystal, this hologram being defined by the image that is electrically written into the VLSI chip.

As a feature of the invention, the reflective liquid crystal comprises a ferroelectric liquid crystal, and this ferroelectric liquid crystal is modulated to on and off states in a pixel fashion, such that reflection of the illumination beam from the on pixels of the ferroelectric liquid crystal operates to interfere with the reference beam, and thereby write a hologram in the photorefractive crystal.

One advantage of the present invention is that the system is more compact than prior art holographic systems.

Another advantage of the invention is that the system can perform both reading and writing of the holograms because it includes both pixels to reflect the illumination beam and photodetectors to read out the stored hologram.

A further advantage of one embodiment the invention is that because of the structure of the apparatus, no imaging system is needed, so the optical power loss is very small.

Those having normal skill in the art will recognize the foregoing and other objects, features, advantages and applications of the present invention from the following more detailed description of the preferred embodiments as illustrated with reference to the accompanying drawings.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The present invention comprises a programmable hologram generator having a layered structure of a pixelated VLSI chip, a reflective crystal that is physically disposed on the VLSI chip, and a photorefractive crystal that is physically disposed on the liquid crystal. An optically transparent and electrically conductive film is positioned intermediate the reflective liquid crystal and the photorefractive crystal, and crystal alignment layers are provided adjacent to the opposite surfaces of the liquid crystal layers, as are well known in the art.

While the invention is described with reference to generally cubic configurations, the invention is not limited to these specific configurations.

Figure 1:
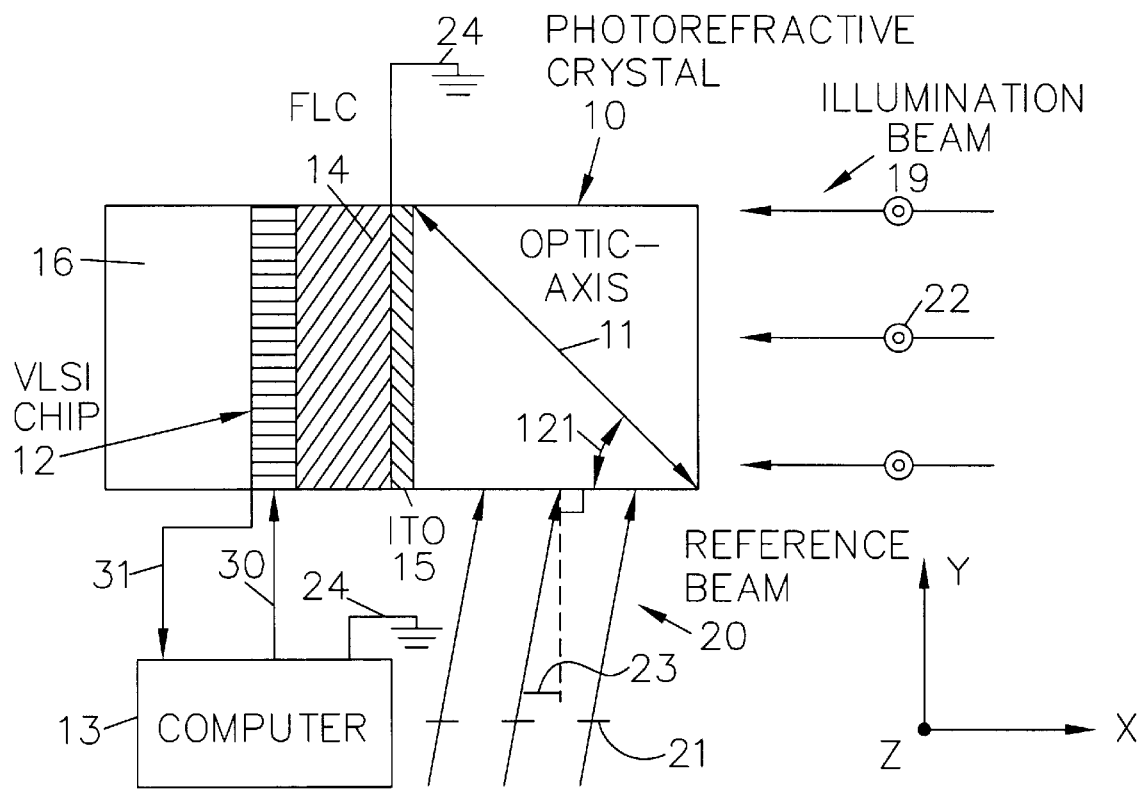
FIG. 1 is a schematic showing a first embodiment of the invention wherein a hologram is written into the photorefractive crystal.

FIG. 1 is a schematic showing a first embodiment of the invention comprising a layered physical structure consisting of a semiconductor substrate member 16, a pixelated VLSI semiconductor chip 12 which can be an electrically addressable pixel array, a reflective liquid crystal 14, a grounded, transparent, and electrically conductive film of indium oxide (ITO) 15, and a photorefractive crystal 10 having an optic axis 11. Film 15 can be any film which transmits at least some of illumination beam 19 and reference beam 20 and preferably transmits all or nearly all of those beams 19 and 20. The potential of film 15 at ground essentially grounds the potential of crystal 10 in the preferred embodiment, although there might be embodiments which call for film 15 to have a potential other than ground.

The semiconductor technology that is used to fabricate VLSI chip 12 is not critical to the invention, and may comprise any of the known technologies, as are well known to those of skill in the art. Electrically addressable pixel array 12 can be a single VLSI chip or a hybrid but will be referred to as a chip throughout this discussion.

Reflective liquid crystal 14 can be any type of liquid crystal and is preferably a bistable birefringent liquid crystal, which, without limitation thereto, comprises a ferroelectric liquid crystal (FLC) of the type describe in the above-mentioned U.S. Pat. No. 4,367,924.

The type of photorefractive crystal 10 that is used in the practice of this invention is not critical; however, use of a cobic $NeLiO_3$ crystal is preferred.

While VLSI chip 12 need contain only a reflective metal crystal modulating pad (501d FIG. 5) for each pixel thereof, in accordance with a feature of the invention, VLSI chip 12 is pixelated (see FIGS. 5 and 6) to provide both a metal pad 17 and a photodetector element 18 for each individual pixel in a planar picture area wherein the pixels thereof are arranged in orthogonal rows and columns according to one embodiment of the invention. While the pixels may take a variety of shapes, in a preferred embodiment the pixels of FIG. 5 are generally square, and in the range of several microns square although this is only one example, and the size of the pixels can vary significantly, e.g., a fraction of a micron square to many microns square.

Metal pads 17 perform two functions; namely, they provide an electrical contact to one surface of liquid crystal 14 whereby a control voltage may be provided to selected pixels of liquid crystal 14, and they provide a reflective surface that is effective for only these selected pixels, which reflective surfaces operate to reflect illumination beam or wavefront 19 from these selected pixels. More specifically, the metal pads 17 that are selected for enervation by computer 13 operate to apply a switching voltage to the physically adjacent pixels of liquid crystal 14. These same metal pads 17 thereafter operate to reflect illumination beam 19 from photorefractive crystal 10. As will be apparent, these two effects take place during the writing of a selected holographic image into photorefractive crystal 10. It should be noted that pads 17 need not be metal pads but are preferably reflective at the frequencies of the illumination beam 19 and the reference beam 20 and are at least partially conductive.

Figure 4:
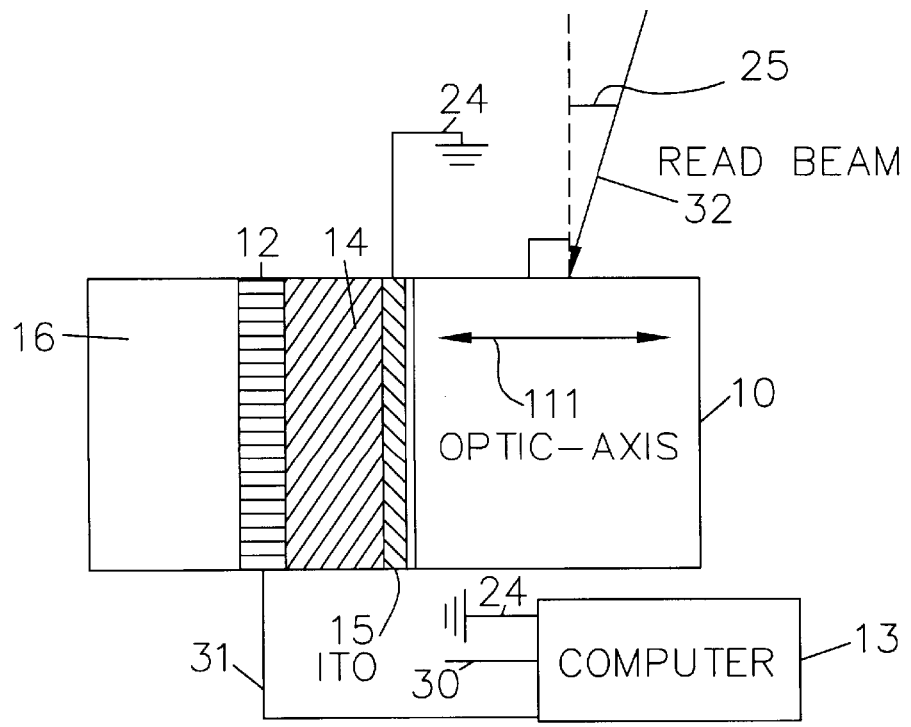
FIG. 4 shows a manner of reading the holograms stored in the photorefractive crystal of FIG. 3 using a VLSI chip that includes an array of pixelated photodetectors.
Figure 5:
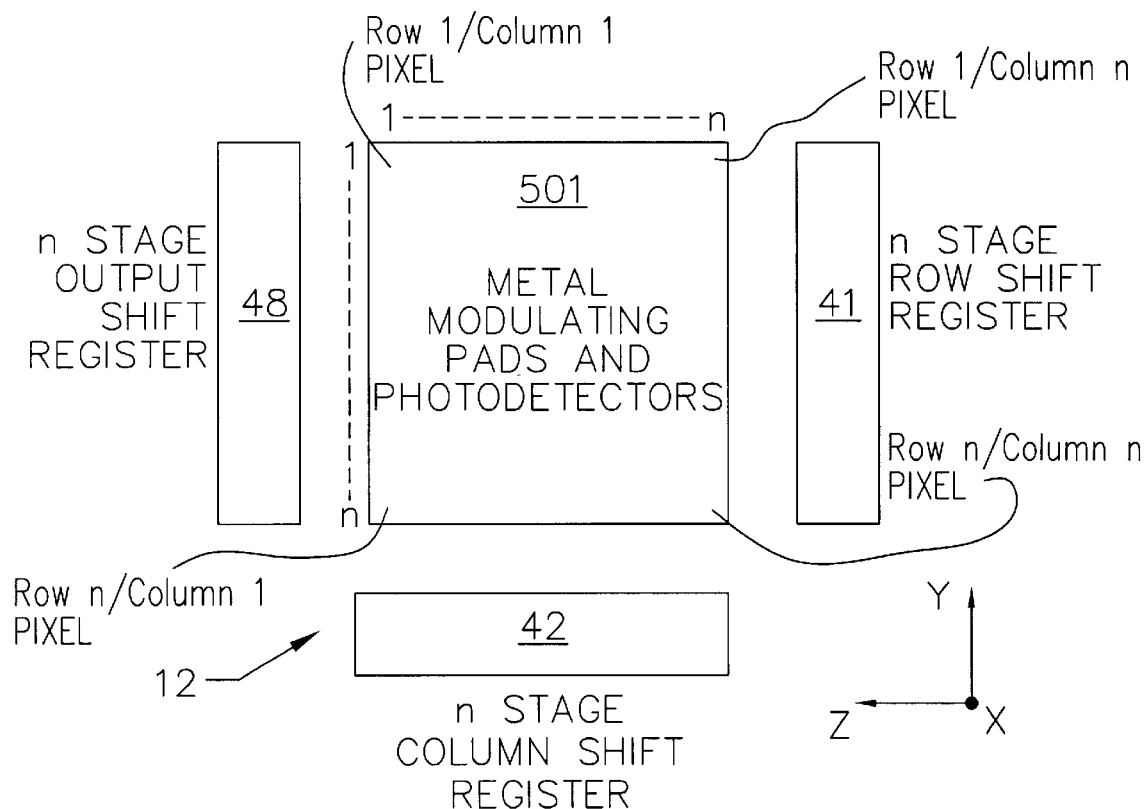
FIG. 5 shows the generally planar layout of the pixelated VLSI chip of FIGS. 1–4 wherein pixels are arranged in rows identified as rows 1–n, and in columns identified as columns 1–n, and FIG. 5 includes identification of an X-Y-Z coordinate system whereby the plane of FIG. 5 may be oriented to FIGS. 1–4.

FIG. 5 shows the generally planar layout of pixelated VLSI chip 12 wherein the pixels thereof are arranged in horizontal rows, identified as rows 1 through n, and in vertical columns, identified as columns 1 through n. FIG. 5 includes the identification of an X-Y-Z coordinate system whereby the plane of FIG. 5 may be oriented to FIGS. 1–4.

Figure 6:
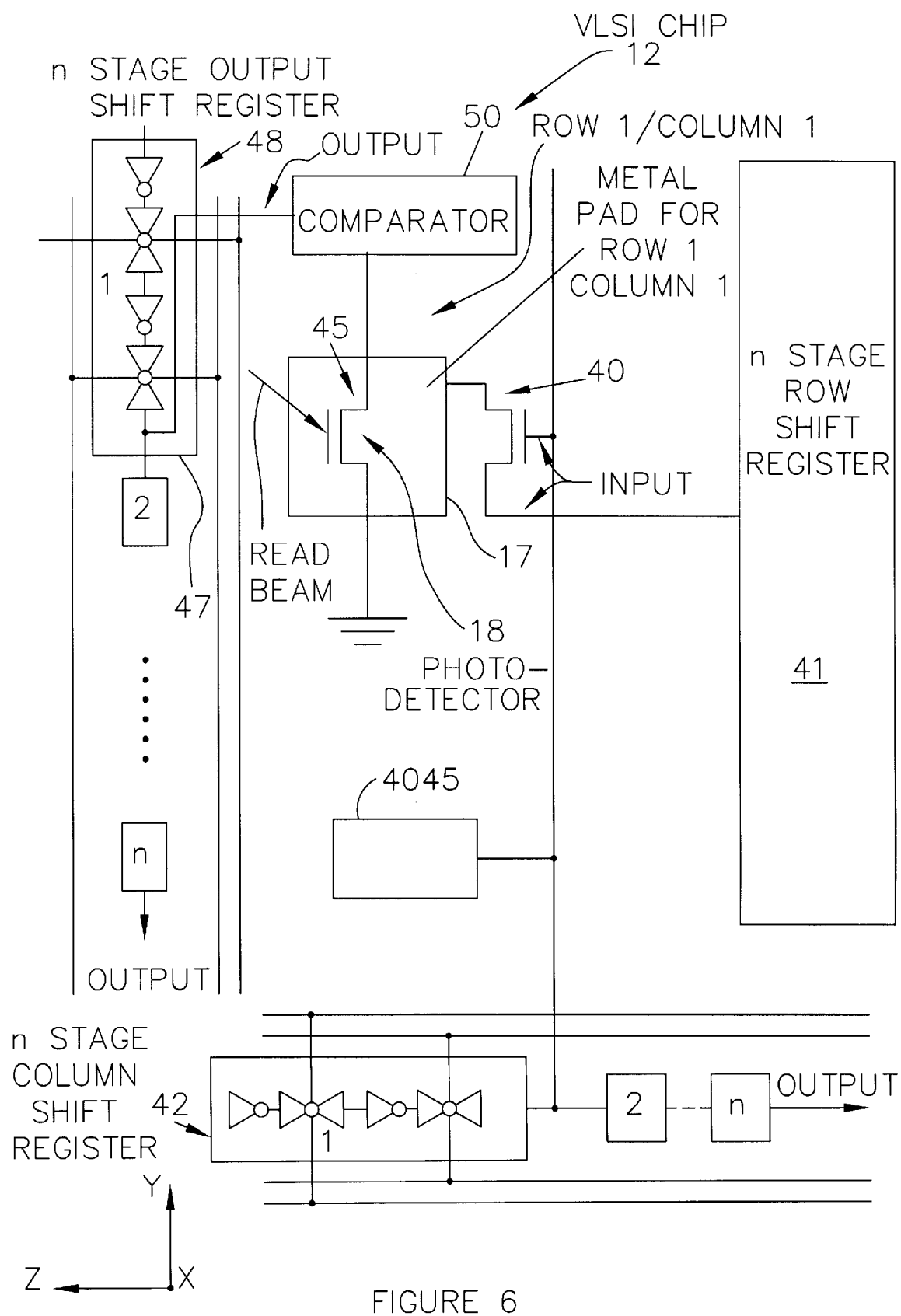
FIG. 6 shows the electrical circuits of the VLSI chip that provide control of the column 1/row 1 pixel of the liquid crystal of FIGS. 1 and 3 during the writing of a hologram into the photorefractive crystal of these two figures, and the electrical circuit for the photodetector of column 1/row 1 pixel of the VLSI chip of FIGS. 2 and 4, which photodetector circuit is used during reading of a hologram that is stored in the photorefractive crystal of these two figures.

FIG. 6 shows the crystal modulating and photodetector electrical circuits of VLSI chip 12 that are associated with the column 1/row 1 pixel of FIG. 5, as will be explained. Similar electrical circuits are associated with each such pixel of the orthogonal X-Y pixel array.

VLSI chip 12 is controlled by computer 13 where holograms are digitally stored in memory in a manner well known to those of skill in the art. In this way, images of holograms are electrically written into selected pixel metal pads 17 of VLSI chip 12, so as to selectively modulate the birefringent state of reflective liquid crystal 14 in pixel fashion.

As is well known, for each pixel of liquid crystal 14 to which a switching voltage is applied by VLSI chip 12 relative to ground potential 24, the birefringent state of those pixel portions of liquid crystal 14 are changed in a bistable and nonvolatile manner. Subsequently, illumination wavefront 19 is reflected with polarization modulation only from the metal pads 17 that correspond to the switched pixels of liquid crystal 14. As a result, illumination 19 is selectively reflected back to photorefractive crystal 10, and a hologram is produced, or written, into photorefractive crystal 10 due to interference of this reflected wavefront with reference beam 20. In a pixel pattern corresponding to the switched pixels of liquid crystal 14, the reflected light or illumination has a polarization that has been rotated 90-degrees, so that this reflected light now interferes with reference beam 20 within the three-dimensional volume of photorefractive crystal 10.

It should be understood that the potential difference between pads 17 and film 15, effects the optical properties of the liquid crystal for that respective pixel. The optical properties at each pixel cause a modulation of certain characteristics of the illumination beam 19 as it passes through that portion of liquid crystal 14 corresponding to that pixel. The modulated characteristic of the beam for the above-discussed liquid crystal 14 is the polarization of the light. The frequency and/or phase of the illumination beam 19 might also be a characteristic which is modulated.

The manner in which beams 19 and 20 interfere to produce a hologram is well known, and will not be described herein.

While not critical to the invention, the wavelength of illumination beam 19 and reference beam 20 are preferably sufficiently close to effect the above-discussed interference within the three-dimensional volume of photorefractive crystal 10.

In FIG. 1 the polarization 21 of reference beam 20 is shown to be parallel to the Y-Z plane of the figure, whereas the polarization 22 of the illumination beam 19 is parallel to the X-Y plane of the figure.

In the embodiment of FIG. 1, optic axis 11 of the photorefractive crystal 10 lies in the X-Y plane of the figure, and extends at an angle 19 to the X direction of propagation of illumination beam 19.

Figure 2:
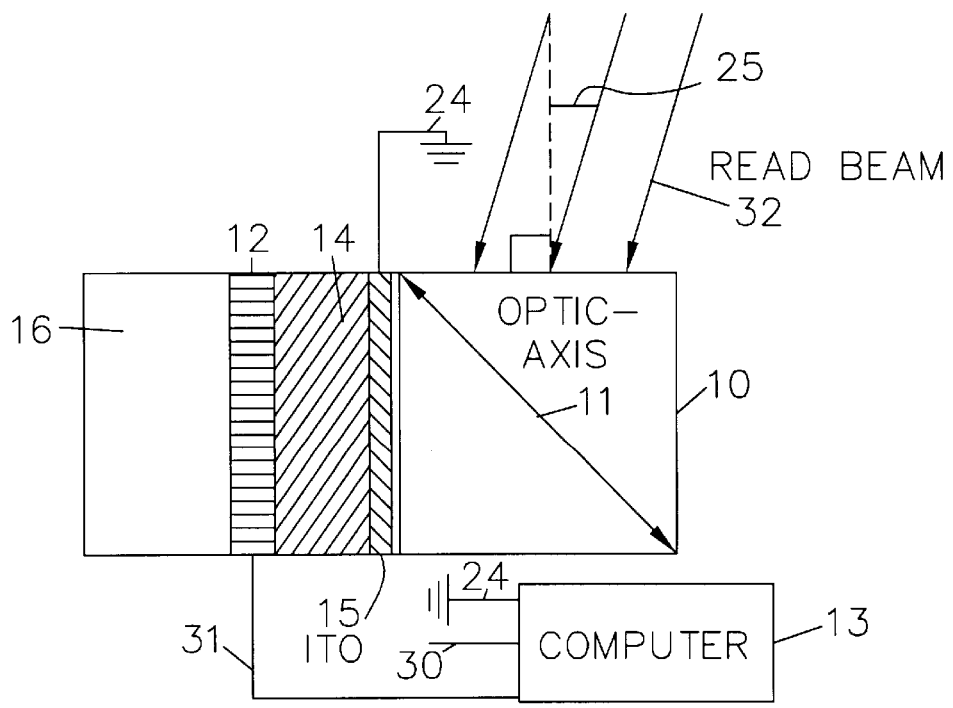
FIG. 2 shows the manner of reading the holograms that are stored in the photorefractive crystal of FIG. 1 using a VLSI chip that includes an array of pixelated photodetectors.

Reference beam 20 is shown as propagating parallel to the X-Y plane, and at an angle 23 to the Y axis. The magnitude of angle 23 is not critical. However, when a number of holograms are written into photorefractive crystal 10, angle 23 is changed for the writing of each hologram, and as will be explained relative to FIG. 2, in order to read out a given hologram, read beam 32 of FIG. 2 is directed at an angle 25 generally equal to the angle 23 of FIG. 1 that was used to write that given hologram into photorefractive crystal 10.

In order to avoid reference beam 20 hitting VLSI chip 12, it is preferred that reference beam 20 impact photorefractive crystal 10 from the bottom and at an angle 23, as shown in FIG. 1.

Reflection of illumination beam 19 from the reflective metal pads 17 (FIG. 6) of the switched pixels of reflective liquid crystal 14 operates to interfere with reference beam 20 within the cubic volume of photorefractive crystal 10, and thereby a hologram is written in photorefractive crystal 10.

In a preferred embodiment of the invention, reflective liquid crystal 14 comprises a ferroelectric liquid crystal whose pixels are selectively modulated to on and off states such that reflection of illumination beam 19 from the on pixels of ferroelectric liquid crystal 14 operates to interfere with reference beam 20, and thereby write a hologram in photorefractive crystal 10.

FIG. 2 shows the reading of holograms that have been stored in photorefractive crystal 10 in the manner above described. FIG. 2 uses a VLSI chip 12 that includes an n-by-n (n×n) array of pixelated photodetectors 18 that are overlapped with an n×n array of pixelated metal modulating pads 17, as is shown in FIG. 6.

FIGS. 1 and 2 show that computer 13 includes an output bus 30 and an input bus 31. Output bus 30 connects to the individual ones of metal pads 17 (see in FIG. 6), and operates to provide the above-described selective energizing of metal pads 17 during the writing of holograms into photorefractive crystal 10.

Input bus 31 connects to the individual ones of photodetectors 18 (FIG. 6), and operates to detect in pixel fashion the reflection of read beam of wavefront 32 from a hologram within photorefractive crystal 10. In this manner, computer 13 of FIG. 2 operates to generate an electrical image that corresponds to the hologram that is being read. The individual hologram that is read out from photorefractive crystal 10 is a function of the angle 25 at which read beam 32 is directed; i.e., selecting an angle 25 operates to select a hologram for readout from photorefractive crystal 10.

While not critical to the invention, it is preferred to avoid any tendency to erase a hologram during read out by using a read beam, or wavefront 32, whose wavelength is different than the common wavelength of illumination beam 19 and reference beam 20 that were used to write holograms into photorefractive crystal 10.

Figure 3:
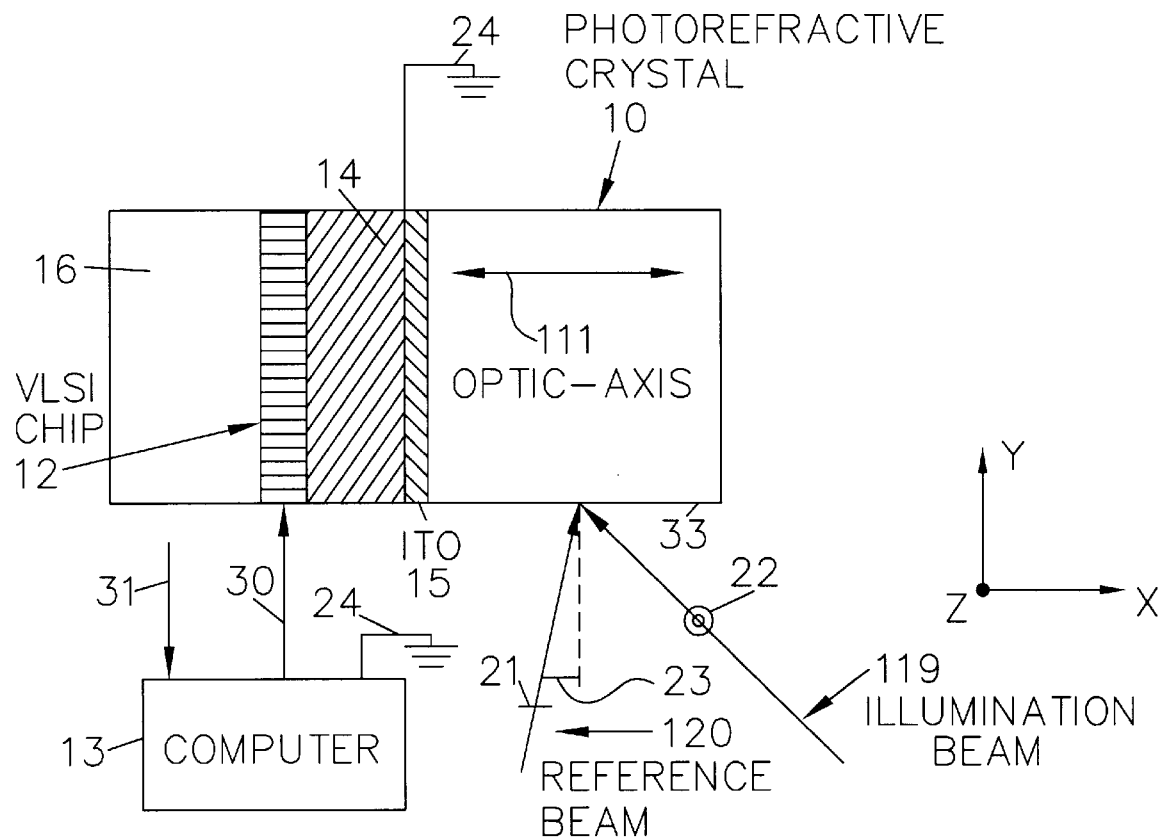
FIG. 3 is a schematic showing a second embodiment of the invention, wherein the optic axis of the photorefractive crystal has been modified so as to allow the reference beam and the illumination, or write beam, to strike the same side of the photorefractive crystal as a hologram is written into the photorefractive crystal.

FIG. 3 is a schematic showing a second embodiment of the invention wherein the direction of the optic axis 111 of photorefractive crystal 10 has been changed so as to allow reference beam 120 and illumination, or write beam 119, to strike the same side 33 of photorefractive crystal 10 as holograms are written into photorefractive crystal 10 in the manner above described.

The embodiment of FIGS. 1 and 2 may provide low diffraction efficiency because the angle between the reflection of read beam 32 from a hologram and reference beam 20 may be quite large; for example, in the range of from 50 to 90 degrees. The embodiment of FIGS. 3 and 4 provide higher diffraction efficiency since the angle between this reflected beam and reference beam 120 varies in a range of from 0 to 50-degrees. A slight disadvantage of the embodiment of FIGS. 3 and 4 is that illumination beam 119 is incident upon the VLSI chip 12 at a tilted angle as compared to the embodiment of FIGS. 1 and 2.

FIG. 5 shows the generally planar layout of pixelated VLSI chip 12 of FIGS. 1–4. By way of example, and without limitation thereto, the pixels of VLSI chip 12 are arranged in a square n×n array comprising rows that are identified as rows 1–n, and columns that are identified as columns 1–n. FIG. 5 also includes the identification of X-Y-Z coordinate system whereby the plan of FIG. 5 may be oriented to FIGS. 1–4.

FIG. 6 shows, according to one embodiment of the invention, the electrical circuits 40 and 45 of VLSI chip 12 that provide input control and output read out, respectively, for one pixel within the n×n array; namely, the column 1/row 1 pixel of VLSI chip 12, corresponding to column 1/row 1 pixel of liquid crystal 14. Similar circuits 40 and 45 are provided on VLSI chip 12 for each pixel of the n×n chip array (represented by circuit 404S).

During the writing of a hologram into photorefractive crystal 10 of FIGS. 1 and 3, modulating circuit 40 is controlled by row shift register 41 and column shift register 42. Shift registers 41 and 42 each comprise n states, and operate to simultaneously control all pixels within the n×n array so as to selectively switch desired ones of the pixels of liquid crystal 14 in accordance with the output 30 from computer 13.

During the read out of a hologram from photorefractive crystal 10, detection circuit 45 that includes one photodetector 18 provides an output to the first stage 47 of an n stage output shift register 48. Output shift register 48 contains n stages each of which receives a similar detector output. As will be appreciated by those of skill in the art, output shift register 48 is shifted from column to column, to sequentially read out the state of detectors 18 within each column of the array. Thus, the shift register is read out n times, one time for each column of the n-by-n array, in order to read out the entire photodetector 18 array during the reading of a hologram that is stored in photorefractive crystal 10.

Figure 7:
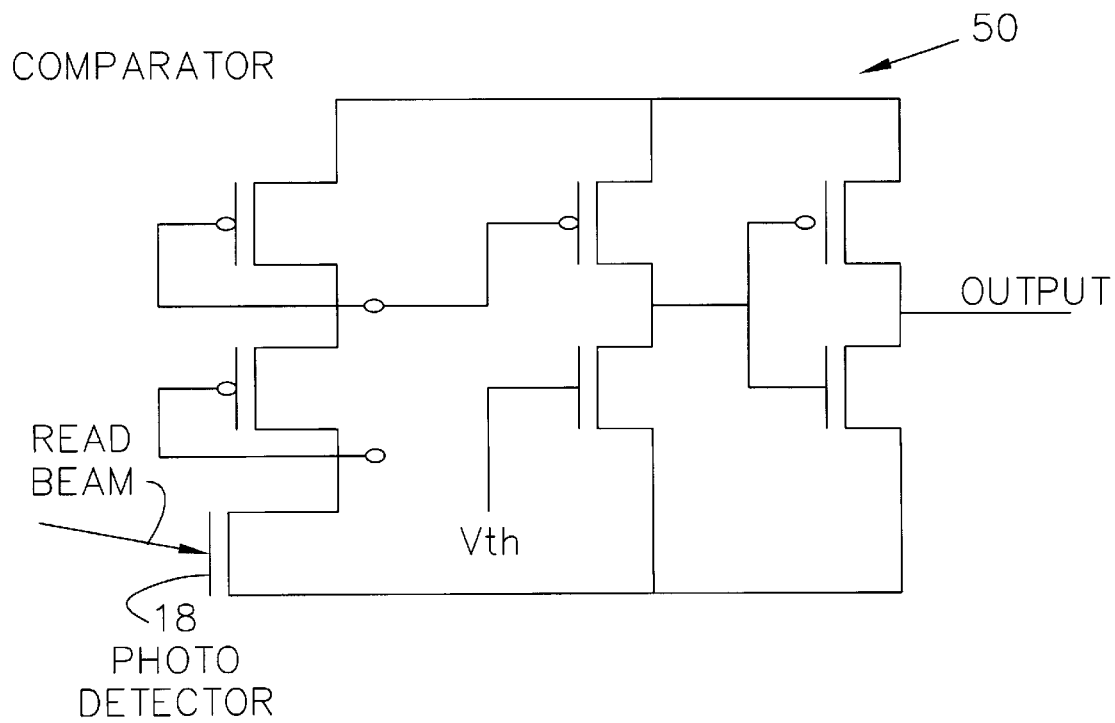
FIG. 7 shows the electrical circuit of the column 1/row 1 comparator of FIG. 6.

Detection circuit 45 includes a comparator circuit 50 whose detailed construction is shown in FIG. 7.

Figure 8:
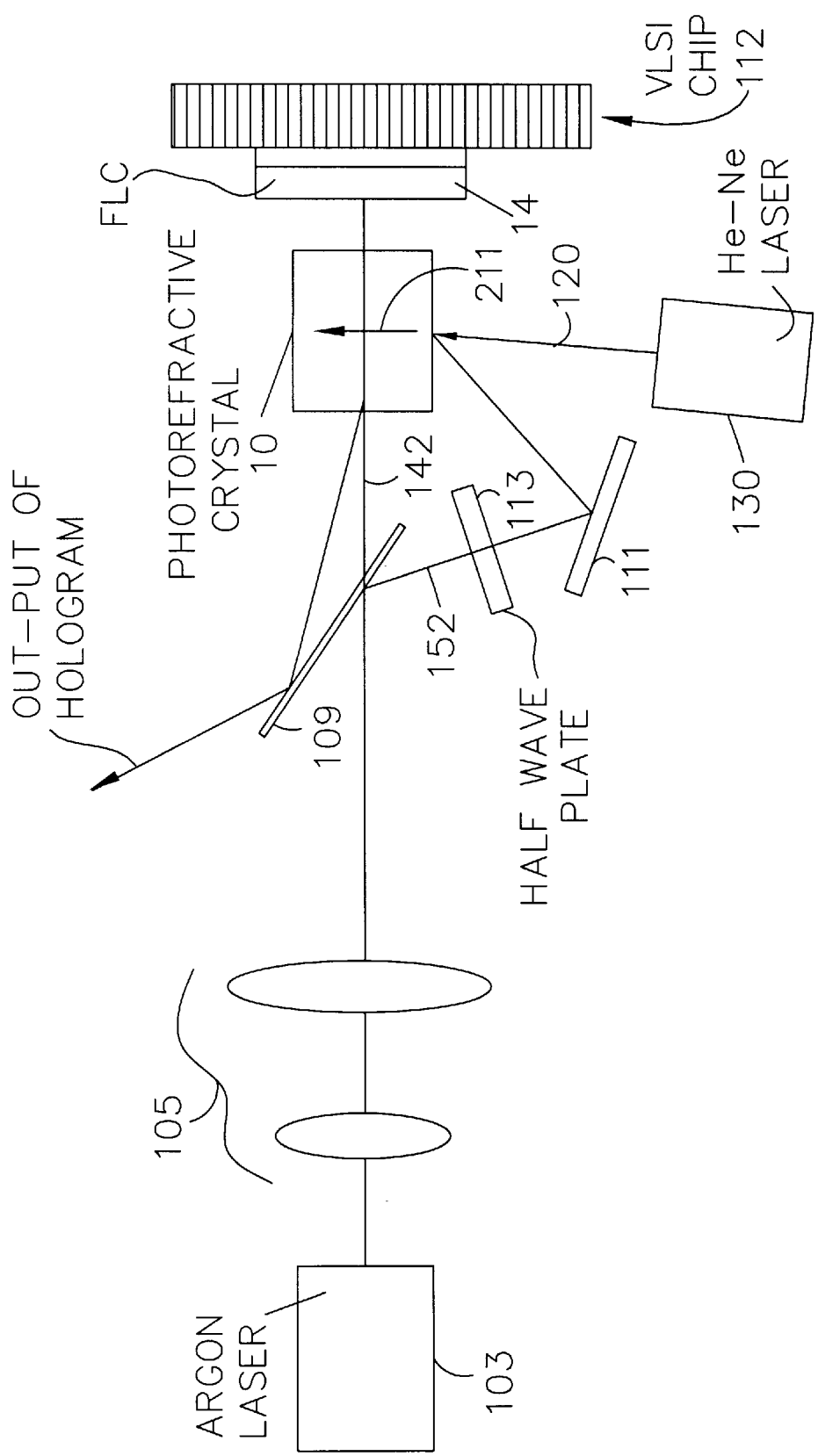
FIG. 8 is a schematic showing a third embodiment of the invention wherein the VLSI chip does not contain a pixelated array of photodetectors, and the holograms stored in the photorefractive crystal are read out optically.

FIG. 8 is a schematic showing a third embodiment of the invention, wherein VLSI chip 112 does not contain a pixelated array of photodetectors 18, such as is shown in FIG. 6, and the holograms that are stored in photorefractive crystal 10 having an optic axis 211 are read out optically.

FIG. 8 includes a laser 103 whose output power can be varied, collimating lenses 105, a beam splitter 109, reflector 111, a half-wave plate 113, photorefractive crystal 10, VLSI chip 112 with liquid crystal 14, and a read laser 130. Laser 103 provides an illumination beam which is collimated by lenses 105 and is split into a first beam 142 and a second beam 152. Beam 142 has a first polarization and passes through photorefractive crystal 10 and liquid crystal 14 to chip 112. Beam 142 is reflected off chip 112 and through photorefractive crystal 10. Second beam 152 passes through half wave plate 113, is reflected off reflector 111 and effects interference with beam 120 of laser 130 to produce a hologram in crystal 10, which is then outputted and reflected off of beam splitter 109.

Figure 9:
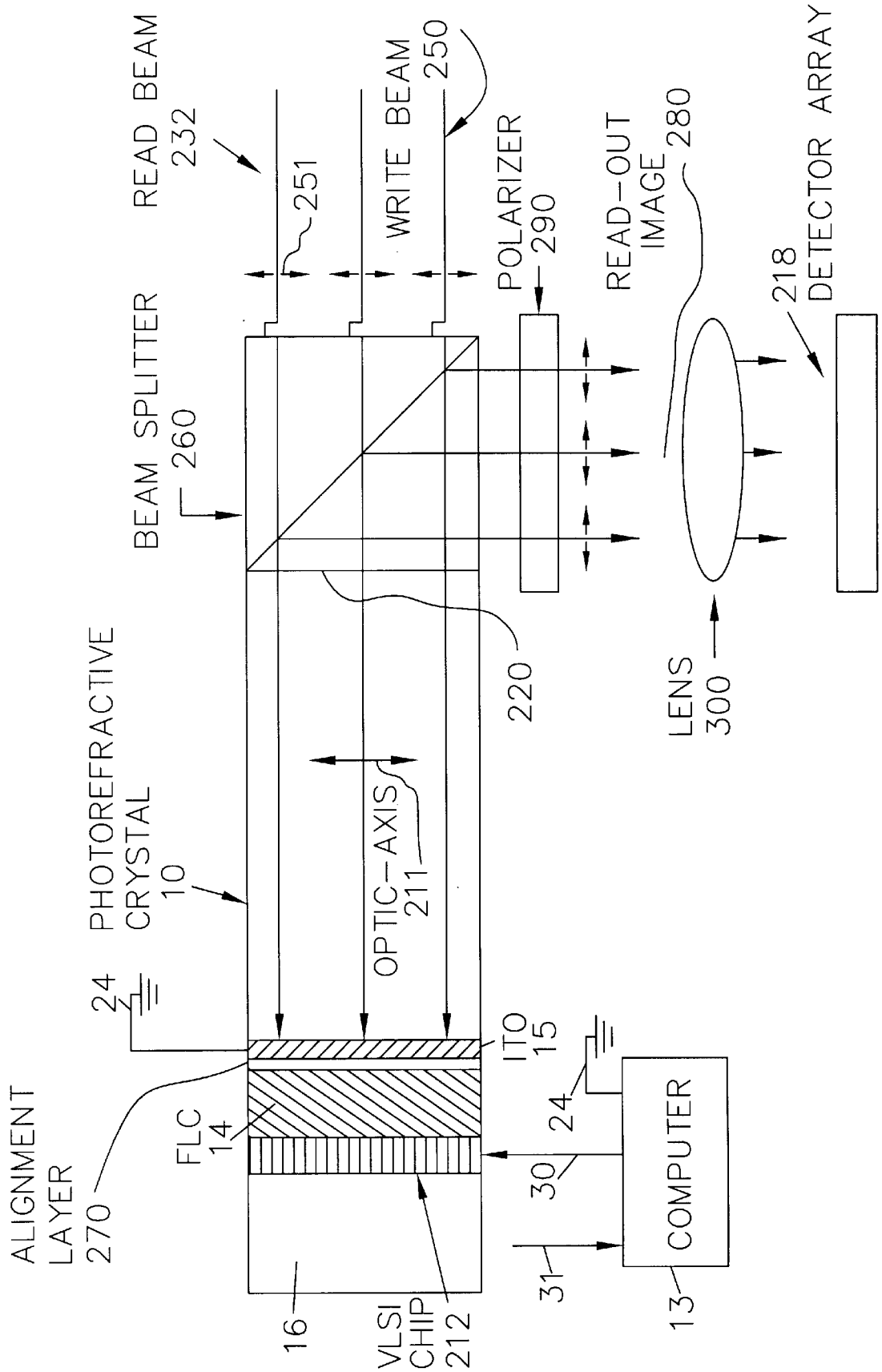
FIG. 9 is a schematic showing a fourth embodiment of the invention wherein the VLSI chip does not contain a pixelated array of photodetectors, and the holograms stored in the photorefractive crystal are read out by an external photodetector array.

FIG. 9 is a schematic showing a fourth embodiment of the invention, wherein VLSI chip 212 does not contain a pixelated array of photodetectors 18, such as is shown in FIG. 6, and wherein the holograms that are stored in photorefractive crystal 10 having optic axis 211 are read out by an external two-dimensional photodetector array 218 having a pixel configuration similar to the pixel configuration of VLSI chip 212.

In this embodiment of the invention, optic axis 211 of photorefractive crystal 10, is vertical and parallel to the surface 220 on which read beam 232 and write beam 250 are incident.

To record a hologram in photorefractive crystal 10, a uniform write beam 250 having parallel polarization 251 is incident upon beam splitter 260. A portion of light beam 250 transmits through beam splitter 260, illuminates photorefractive crystal 10, and reaches VLSI chip 212. The resulting light that is reflected from VLSI chip 212 back to photorefractive crystal 10 has no polarization rotation corresponding to the on, or switched, pixels of liquid crystal 14, and has 90 degree rotation (i.e., rotation to horizontal) corresponding to the off or unswitched pixels of liquid crystal 14. This polarization modulation is achieved by aligning optic axis of liquid crystal 14 in parallel for the on, or switched state. This is done using alignment layer 270.

Write beam 250 and the light that is reflected from the on or switched pixels of liquid crystal 14 have their polarizations in the same vertical plane with vertical optic axis 211 of photorefractive crystal 10, and a hologram is thus recorded in photorefractive crystal 10 due to interference of these two beams.

In order to record a number of holograms in photorefractive crystal 10, the angle of incidence of write beam 250 is changed from the horizontal direction that is shown in FIG. 9.

In order to read the holograms thus recorded in photorefractive crystal 10, all pixels of liquid crystal 14 are first set to the off, or unswitched state, by operation of VLSI chip 212. The same incident light beam is then used as a read beam 232. The resulting light reflected from the hologram is partially reflected downward by beam splitter 260, and a two-dimensional read out image 280 is presented to two-dimensional detector array 218. A polarizer 290 is used to discriminate against vertically polarized light that is reflected from the unswitched state of liquid crystal 14. As a result of the operation of polarizer 290, a horizontally polarized read out image 280 is formed. A lens 300 operates to focus read out image 280 onto photodetector array 218.

Figure 10:
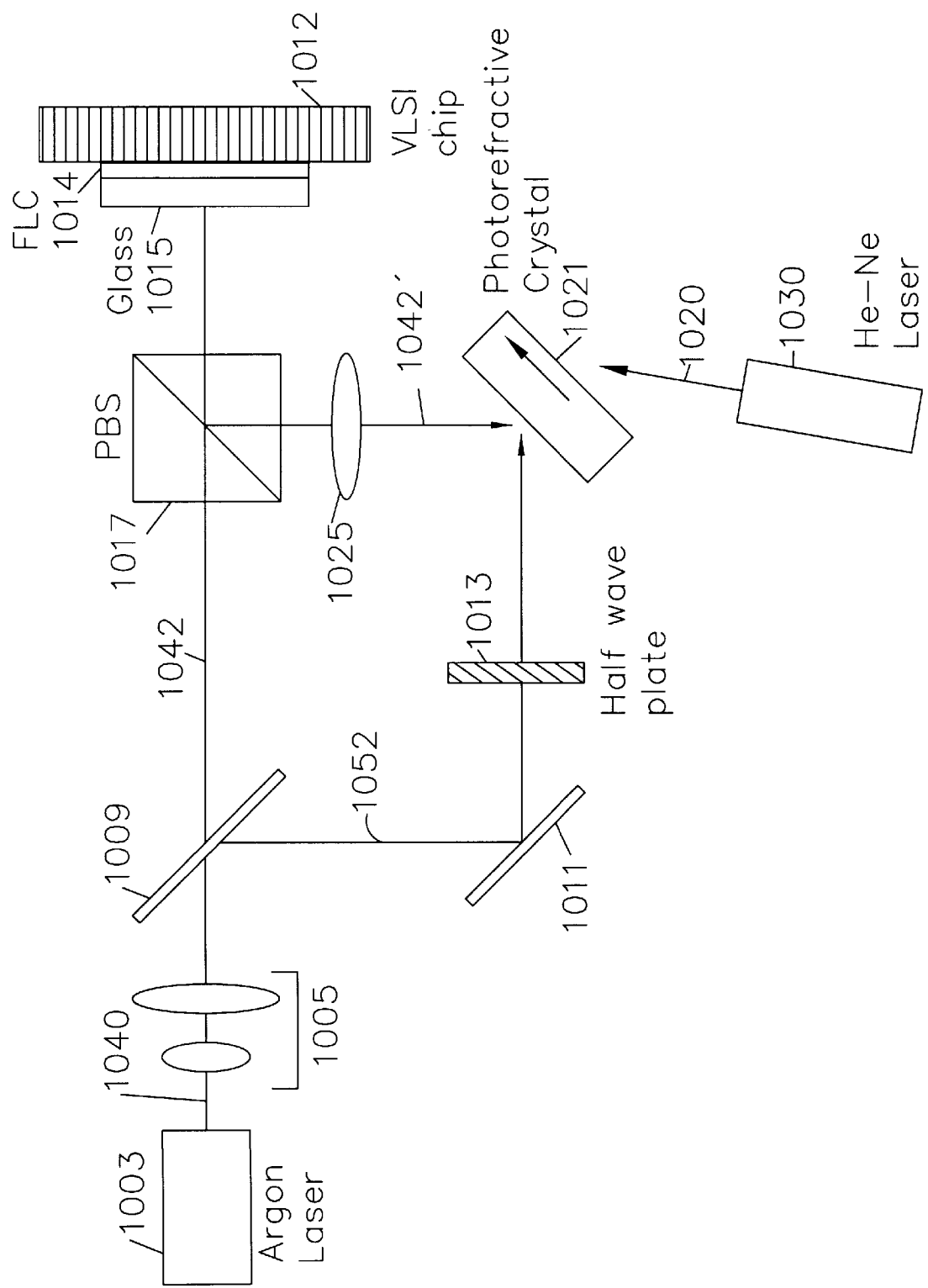
FIG. 10 is a configuration of elements for writing holograms using the general concepts of the FIG. 1 embodiment.

FIG. 10 is a configuration of elements suitable for writing a hologram into the photorefractive crystal shown. An imaging lens is used so that at least 50% of the reflected power is lost, whereas with a FIG. 1 embodiment, no reflected power is lost. Thus, the FIG. 10 embodiment is useful to determine the optical power (i.e., the chip reflected power) required to write a hologram into the photorefractive crystal in the FIG. 10 embodiment, as well as in the other embodiments disclosed herein.

FIG. 10 includes a laser 1003 whose output power can be varied, collimating lenses 1005, a beam splitter 1009, reflector 1011, a half-wave plate 1013, a beam splitter 1017, photo refractive crystal 1021, lens 1025, VLSI chip 1012 with liquid crystal 1014, glass plate 1015, and a read laser 1030. Laser 1003 provides an illumination beam 1040 which is collimated by lenses 1005 and is split into a first beam 1042 and a second beam 1052. Beam 1042 has a first polarization and passes through beam splitter 1017 and then through glass 1015 and liquid crystal 1014 to chip 1012. Beam 1042 is reflected off pads 17 (as discussed above) and modified beam 1042' (only those pixelated portions of beam 1042 which underwent a 90 degree polarization rotation are reflected by beam splitter 1017) reaches photorefractive crystal 1021. Second beam 1052 passes through half wave plate 1013 in order to rotate its polarization to match that of modified beam 1042' in order to effect interference with modified beam 1042' to produce a hologram in crystal 1021.

Laser 1030 is used to provide a reference beam 1020 to read the hologram stored in crystal 1021 in order to determine whether the power levels of mixed beams 1042 and 1052 were sufficient, that is whether the power level of beam 1042 and 1052 were sufficient to record the hologram. If laser 1030 cannot read back any information, the pixels on VLSI chip 1012 can be turned off to clear any storage in crystal 1021 and then the power level of laser 1003 can be increased and the hologram again stored in crystal 1021. This process is repeated until the power level of beams 1042 and 1052 are sufficiently great such that the resulting hologram can be read back.

As is apparent, the invention has been described while making detailed reference to preferred embodiments thereof. Other embodiments of the invention that are within the spirit and scope of the invention will of course be apparent to those of skill in the art. The above-detailed description is thus not intended to be a limitation on the spirit and scope of the invention. That is, while the exemplary preferred embodiments of the present invention are described herein with particularity, those having normal skill in the art will recognize various changes, modifications, additions and applications other than those specifically mentioned herein without departing from the spirit of this invention.

What is claimed is:

1. An electrically programmable hologram generator, comprising:
    a pixelated semiconductor device having a plurality of metallic pads physically arranged to define a pad pixel pattern, each of said metallic pads being electrically conductive;
    a liquid crystal having a first and a second surface, said first surface being in physical engagement with said metallic pads, and said metallic pads defining a corresponding liquid crystal pixel pattern for said liquid crystal;
    individual pixels within said liquid crystal pixel pattern being switchable to one of two states as a result of a control voltage applied thereto;
    an electrically conductive film in physical engagement with said second surface of said liquid crystal, wherein said electrically conductive film is beam transparent;
    electrical control means, coupled to said metallic pads, to apply said control voltage between selected ones of said plurality of metallic pads and said electrically conductive film, and operable to switch corresponding selected ones of said individual pixels of said liquid crystal in accordance with an electrical input data; and
    a photorefractive crystal, physically associated with said electrically conductive film, for receiving a reference beam of a first characteristic, an illumination beam of a second characteristic, and a reflected illumination beam of a third characteristic, wherein said reflected illumination beam interferes with said reference beam to write a hologram into said photorefractive crystal.

2. The hologram generator of claim 1, wherein said liquid crystal comprises a ferroelectric liquid crystal.

3. The hologram generator of claim 1, wherein said photorefractive crystal comprises a cobic $NeLiO_3$ crystal.

4. The hologram generator of claim 1, wherein said electrically conductive film comprises indium oxide.

5. The hologram generator of claim 1, wherein said metallic pads selectively reflect said illuminating beam to produce said reflected illuminating beam.

6. The hologram generator of claim 1, wherein said photorefractive crystal physically engages said electrically conductive film.

7. The hologram generator of claim 1, wherein said pixelated semiconductor device is a chip.

8. The hologram generator of claim 1, wherein said pixelated semiconductor device is a hybrid.

9. The hologram generator of claim 1, wherein said first characteristic, said second characteristic, and said third characteristic are polarization.

10. The hologram generator of claim 1, wherein an angle between said reference beam and said reflected illumination beam varies in a range of from 0 and 50 degrees.

11. The hologram generator of claim 1, further including:
    a plurality of beam detectors physically arranged to define a detector pixel pattern corresponding to said pad pixel pattern, said beam detectors being physically arranged to intercept a reflected read beam produced by reflection of a read beam from said hologram within said photorefractive crystal; and
    signal responsive means, connected to said beam detectors, to provide a detector output corresponding to said hologram within said photorefractive crystal.

12. The hologram generator of claim 11, wherein said plurality of beam detectors are arranged to physically correspond to the positions of said plurality of metallic pads.

13. The hologram generator of claim 11, wherein said read beam and said illumination beam are of different frequencies.

14. The hologram generator of claim 11, wherein said metallic pads are square.

15. The hologram generator of claim 11, wherein said pad pixel pattern is square.

16. A method for generating holograms, comprising the steps of:
    arranging a physical structure comprising a pixelated semiconductor device, a liquid crystal, and a photorefractive crystal, wherein said pixelated semiconductor device includes a pad pixel pattern of metallic pads operatively associated with said liquid crystal and operating to define a liquid crystal pixel pattern for said liquid crystal;
    electrically writing an electrical input data into said pad pixel pattern so as to modulate said liquid crystal pixel pattern corresponding to said electrical input data;
    providing a reference beam to said photorefractive crystal;
    further providing an illumination beam to said liquid crystal; and
    reflecting said illumination beam to produce a reflected illumination beam which interferes with said reference beam and writes a hologram, corresponding to said electrical input data, in said photorefractive crystal.

17. The method for generating holograms of claim 16, wherein said step of reflecting includes said metallic pads selectively reflecting said illuminating beam to produce said reflected illuminating beam.

18. The method for generating holograms of claim 16, wherein said step of electrically writing includes receiving data from an electronic control means.

19. The method for generating holograms of claim 16, wherein said step of electrically writing includes the step of modulating pixels of said liquid crystal to on and off pixel states.

20. The method for generating holograms of claim 16, wherein said step of reflecting includes arranging said reference beam and said reflected illumination beam at an angle between 0 and 50 degrees.

21. The method for generating holograms of claim 16, further including the step of:

further arranging a detector pixel pattern of photodetectors corresponding to said pad pixel pattern;

reading said hologram by injecting a read beam into said photorefractive crystal and measuring a reflected read beam at said detector pixel pattern.

22. The method for generating holograms of claim 21, wherein said step of further arranging includes providing a further electronic control means, coupled to said detector pixel pattern, for monitoring a detector output from said detector pixel pattern.

23. The method for generating holograms of claim 21, wherein said detector pixel pattern is co-located with said pad pixel pattern.

24. A memory device, comprising:

an electrically addressable pixel array comprising a plurality of pixels for receiving electrical data, each of said plurality of pixels comprising:

a photodetector; and a reflective pad;

a liquid crystal layer arranged on said electrically addressable pixel array;

an electrically conductive film arranged on said liquid crystal layer, which together with each of said pads yields a corresponding plurality of pixel voltages across said liquid crystal layer; and a photorefractive crystal, wherein an illumination beam travels through said liquid crystal layer, said plurality of pixel voltages yield a corresponding polarization modified illumination beam at respective pixels, respective portions of which interfere with a reference beam within said photorefractive crystal.

25. A memory device, comprising:

an electrically addressable pixel array comprising a plurality of pixels for receiving electrical data, each of said plurality of pixels including a reflective pad;

a liquid crystal layer arranged on said electrically addressable pixel array;

an electrically conductive film arranged on said liquid crystal layer, which together with each of said pads yields a corresponding plurality of pixel voltages across said liquid crystal layer; and a photorefractive crystal, wherein an illumination beam travels through said liquid crystal layer, said plurality of pixel voltages yield a corresponding polarization modified illumination beam at respective pixels, respective portions of which interfere with a reference beam within said photorefractive crystal.

* * * * *